United States Patent
Hayakawa

(10) Patent No.: US 6,873,022 B2
(45) Date of Patent: Mar. 29, 2005

(54) SEMICONDUCTOR DEVICE AND METHOD FOR MANUFACTURING THE SAME

(75) Inventor: Yukio Hayakawa, Aizuwakamatsu (JP)

(73) Assignee: FASL LLC, Sunnyvale, CA (US)

( * ) Notice: Subject to any disclaimer, the term of this patent is extended or adjusted under 35 U.S.C. 154(b) by 0 days.

(21) Appl. No.: 10/662,810

(22) Filed: Sep. 16, 2003

(65) Prior Publication Data

US 2004/0089902 A1 May 13, 2004

(30) Foreign Application Priority Data

Sep. 19, 2002 (JP) ......................................... 2002-273624

(51) Int. Cl.⁷ ........................ H01L 29/94; H01L 31/062
(52) U.S. Cl. ........................ 257/412; 257/388; 257/413
(58) Field of Search ................................ 257/412, 388, 257/413

(56) References Cited

U.S. PATENT DOCUMENTS 5,903,053 A * 5/1999 Iijima et al. ................. 257/751

FOREIGN PATENT DOCUMENTS

CN 432509 5/2001

OTHER PUBLICATIONS

Patent Abstracts of Japan, Publication No. 10–209296, published Aug. 7, 1998./Discussed in the specification.
Patent Abstracts of Japan, Publication No. 7–37992, published Feb. 7, 1995./Discussed in the specification.

* cited by examiner

Primary Examiner—David Nelms
Assistant Examiner—Tu-Tu Ho
(74) Attorney, Agent, or Firm—Westerman, Hattori, Daniels & Adrian, LLP

(57) ABSTRACT

In a gate electrode, above a first polycrystalline silicon film, a second polycrystalline silicon film, which has a predetermined silicon crystal face orientation directed with respect to and is smaller in crystal diameter than the first polycrystalline silicon film, is provided, so that even if there locally exist portions which are different in silicidization speed in forming a silicide layer in the second polycrystalline silicon film, the silicidization reaction with unreacted portions of the second polycrystalline silicon film can occur faster than the silicidization reaction with the first polycrystalline silicon film.

28 Claims, 13 Drawing Sheets

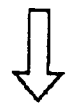

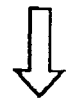

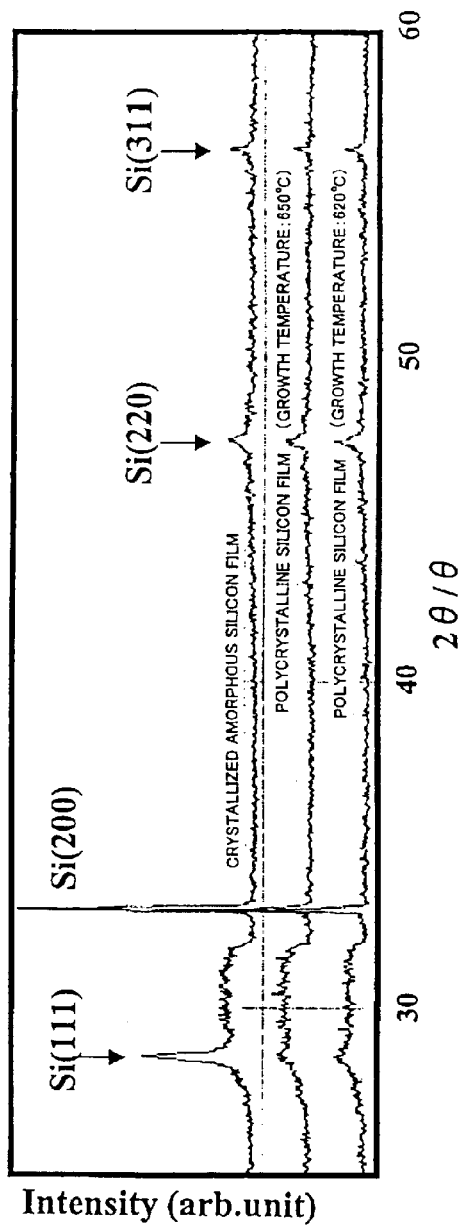

⟨DEPENDENCE OF SILICIDE RESISTANCE ON FILM THICKNESS OF AMORPHOUS SILICON FILM⟩

<DEPENDENCE OF COBALT SILICIDE RESISTANCE ON WIDTH OF WIRE>

<OVER SILICIDIZATION REACTION POINT EXAMINED IN PHOTOGRAPH OF CROSS SECTION>

CoSi2
Poly-Si
CoSix

<PHOTOGRAPH OF CROSS SECTION OF $CoSi_2$ FORMATION DEFECT POINT>

CoSi2
Poly-Si
Si
0.2μm

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2002-273624, filed on Sep. 19, 2002, the entire contents of which are incorporated herein by reference.

BACKGROUND OF THE INVENTION

1. Field of the Invention

The present invention relates to a semiconductor device and a method for manufacturing the same, and more particularly, to a semiconductor device with a silicide layer in a gate electrode and a method for manufacturing the same.

2. Description of the Related Art

In recent years, with demand for high integration and miniaturization of semiconductor devices, gate electrodes are also getting smaller. In this case, a technology for silicidizing a gate electrode made of polycrystalline silicon is in wide use as a technique for decreasing the resistance value of the gate electrode to enable high-speed operation.

(Patent Document 1)
Japanese Patent Laid-open No. Hei 10-209296
(Patent Document 2)
Japanese Patent Laid-open No. Hei 7-37992

However, further progress made in miniaturization of semiconductor devices causes various problems when a gate electrode is silicidized in producing a CMOS transistor, as described below, due to a polycrystalline silicon film in which a silicide layer is to be formed.

One of the problems is that a gate electrode made of polycrystalline silicon film formed smaller in width accompanying miniaturization of the semiconductor device causes a so-called thin wire effect in which the resistance value of a high melting point metal silicide layer to be formed on the gate electrode increases. For example, FIG. 12 shows a characteristic chart of the resistance value of a cobalt silicide layer ($CoSi_2$ layer) when formed on a gate electrode. This chart shows that when the width of the gate electrode is about 0.1 μm or less, the resistance value sharply increases, thus prominently showing the thin wire effect.

Another problem is that projections and depressions on an interface between the silicide layer formed on the gate electrode and the polycrystalline silicon film cause the silicide layer to contract upon application of a stress such as heat treatment or the like, thus increasing variations in the resistance value of the silicide layer. Still another problem is that when a silicide layer is locally excessively formed on the gate electrode, a stress is generated in polycrystal in a base film to cause deterioration of a gate insulation film.

SUMMARY OF THE INVENTION

The present invention has been made in view of the above-described problems, and it is an object to realize a highly reliable semiconductor device and a method for manufacturing the same which restrain an increase in resistance value of a gate electrode due to the thin wire effect, decrease resistance variations of the gate electrode, and prevent deterioration of a gate insulation film.

As a result of earnest studies, the inventor of the present invention has devised aspects of the invention as described below.

A semiconductor device of the present invention is characterized by including a semiconductor substrate; a gate insulation film formed on the semiconductor substrate; and a gate electrode formed on the gate insulation film, the gate electrode including: a first polycrystalline silicon film formed on the gate insulation film; and a second polycrystalline silicon film formed above the first polycrystalline silicon film, the second polycrystalline silicon film being in a different crystal state from the first polycrystalline silicon film, and at least an upper layer thereof being silicidized.

A method for manufacturing a semiconductor device of the present invention is characterized by including a first step of forming a first polycrystalline silicon film above a semiconductor substrate with a gate insulation film intervening therebetween; a second step of forming above the first polycrystalline silicon film a second polycrystalline silicon film different in crystal state from the first polycrystalline silicon film; and a third step of silicidizing at least an upper portion of the second polycrystalline silicon film to form a gate electrode including the first polycrystalline silicon film and the silicidized second polycrystalline silicon film.

BRIEF DESCRIPTION OF THE DRAWINGS

FIGS. 3A and 3B are a characteristic chart and table of various silicon films;

DETAILED DESCRIPTION OF THE PREFERRED EMBODIMENTS

Outline of Semiconductor Device of the Present Invention and Method for Manufacturing the Same The following description will be made on the outline of a semiconductor device of the present invention and a method for manufacturing the same.

As described above, a gate electrode made smaller in width in response to the demand for miniaturization of a semiconductor device causes a so-called "thin wire effect" problem in which the resistance value of a silicide layer to be formed on the gate electrode increases, which effect is particularly prominent on an N-type gate electrode. In addition, the silicide layer formed on the gate electrode made of polycrystalline silicon film has many unreacted portions of silicon.

Figure 12:
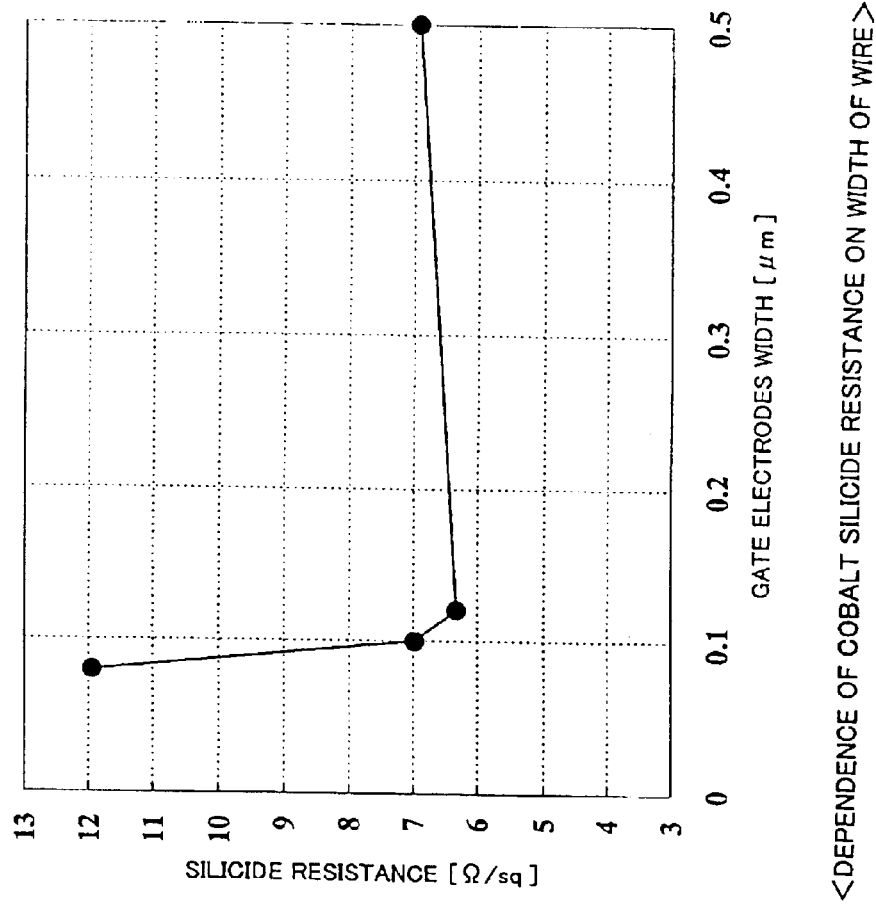
FIG. 12 is a characteristic chart of a resistance value of a cobalt silicide layer ($CoSi_2$ layer) when formed on a gate electrode in a conventional semiconductor device.
Figure 13:
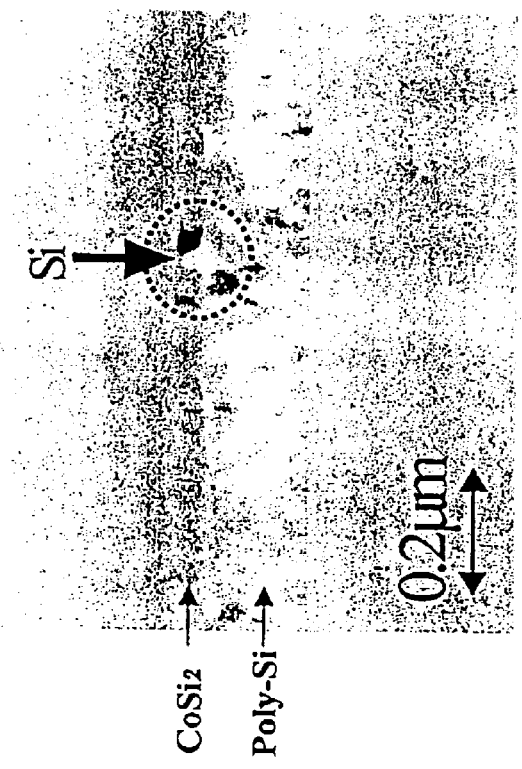
FIG. 13 is a microphotograph showing a surface state of a formation defect portion of a cobalt silicide layer formed in a polycrystalline silicon film.

FIG. 13 is a cross-sectional view of a cobalt silicide layer formed in the polycrystalline silicon film. This drawing shows that the size of an unreacted portion of silicon existing in the cobalt silicide layer is about 0.1 $\mu$m. The above-described unreacted portions of silicon uniformly exist in the silicide layer in a conventional gate electrode, and these unreacted portions of silicon cause a local break in wire in a gate electrode made smaller in width. Accordingly, when a cobalt silicide layer is formed on the gate electrode, the cobalt silicide layer increases in resistance value when the width of the gate electrode is about 0.1 $\mu$m or less as shown in FIG. 12.

Figure 14:
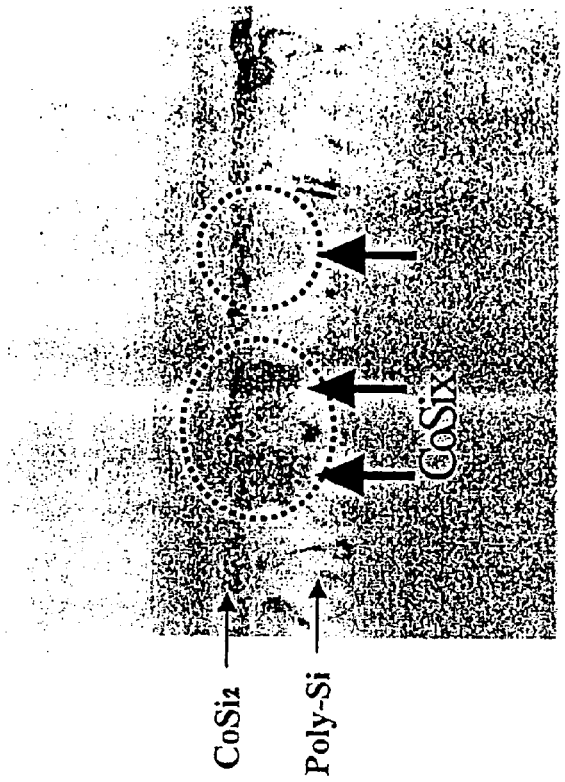
FIG. 14 is a microphotograph showing a surface state of a cobalt silicide layer formed in a polycrystalline silicon film.

FIG. 14 is a cross-sectional view of a formation state of a cobalt silicide layer formed in a polycrystalline silicon film examined under a transmission electron microscope (TEM). This drawing shows that a silicide layer is locally excessively formed to produce projections and depressions of the silicide layer. These projections and depressions of the silicide layer cause contraction thereof upon application of a stress such as heat treatment or the like thereto, thus increasing variations in resistance value of the silicide layer. Further, local variation in lattice constant in the polycrystalline silicon film caused by over silicidization reaction generates a stress in the polycrystalline silicon film to induce deterioration of a gate insulation film.

As described above, silicidization of a polycrystalline silicon film makes the problems more complicated because of occurrence of unreacted portions of silicon in a silicide layer and formation of excess silicide layer.

Hence, the inventor of the present invention devised a semiconductor device with a gate electrode composed of two-layer structure polycrystalline silicon films which are different in crystal state, for example, crystal face orientation and crystal particle diameter, as means for restraining occurrence of unreacted portions of silicon and formation of excess silicide layer.

Figure 1:
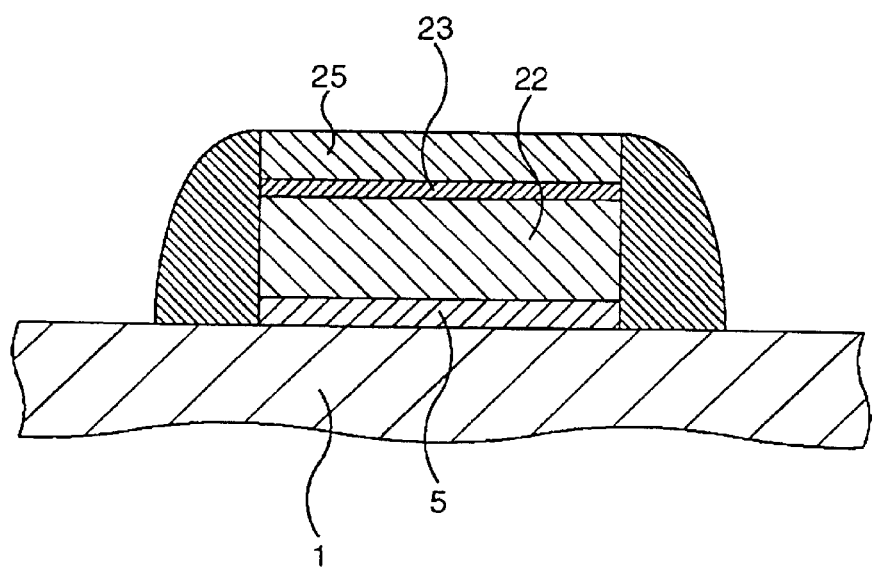
FIG. 1 is a schematic diagram for explaining main principles of a semiconductor device of the present invention.

FIG. 1 shows a schematic diagram of a semiconductor device for explaining the outline of the present invention.

This semiconductor device includes a gate electrode having a two-layer structure composed of a first polycrystalline silicon film 22 which is formed above a semiconductor substrate 1 with a gate insulation film 5 intervening therebetween and a second polycrystalline silicon film 25 which is formed thereabove with a separation layer 23 intervening therebetween and is different in crystal state such as crystal face orientation, crystal particle diameter, and so on from the first polycrystalline silicon film 22.

The second polycrystalline silicon film 25, which has a predetermined crystal face orientation directed with respect to and is smaller in crystal diameter than the first polycrystalline silicon film 22, is formed above the first polycrystalline silicon film 22 as described above. Even if there locally exist portions having different silicidization speeds in forming a silicide layer, the above configuration makes it possible to delay the reaction with the first polycrystalline silicon film 22 and allow the silicidization reaction with unreacted portions of the second polycrystalline silicon film. Thereby, a silicide layer can be formed which is reduced in occurrence of unreacted portions of silicon and protrusions and depressions.

The second polycrystalline silicon film 25 in which the silicide layer is to be formed was improved in film quality, and as a result, it was devised that a polycrystalline silicon film is required which has a crystal face orientation with a small mismatch in lattice constant with the silicide layer. For example, when the silicide layer is a cobalt silicide layer, the polycrystalline silicon film, in particular, has a silicon crystal face orientation (111) with a lattice constant of 31.83 nm, which is a small mismatch with the cobalt silicide crystal face orientation (111) with a lattice constant of 30.80 nm, so that an excellent cobalt silicide can be formed. Hence, it is required to form a polycrystalline silicon film which is easy to direct in the silicon crystal face orientation (111) as the second polycrystalline silicon film 25 in which the silicide layer is formed. Therefore, a method of crystallizing an amorphous silicon film by heat treatment was devised as a technique for forming this polycrystalline silicon film.

As shown in FIG. 3A, the result is that the silicon crystal face orientation (111) is more easily directed in a polycrystalline silicon film formed by crystallizing an amorphous silicon film than in an ordinal polycrystalline silicon film. Then, in such a second polycrystalline silicon film 25 in which the silicon crystal face orientation (111) is directed, the silicidization reaction is accelerated to make less unreacting silicon. As a result, as shown in the resistance value characteristics in FIG. 3B, a cobalt silicide layer can be formed which is lower in resistance than that of the ordinal polycrystalline silicon film.

To form the second polycrystalline silicon film 25, it is necessary to form a very thin and uniform separation layer 23 on the first polycrystalline silicon film 22. This separation film 23 includes, for example, an oxide film layer which is formed very thin to a film thickness of about 0.2 nm to about 1.0 nm by a chemical treatment using hydrochloric acid or the like. Thus provided separation layer 23 enables prevention of growth of the second polycrystalline silicon film 25 with the first polycrystalline silicon film 22 as a core during formation of the second polycrystalline silicon film 25 by the CVD method.

Further, the separation layer 23 can control the silicidization reaction of a high melting point metal. For example, in forming a cobalt silicide layer using cobalt as a high melting point metal when the separation layer 23 is formed of an oxide film, this oxide film can intercept the silicidization reaction with the first polycrystalline silicon film 22 because a cobalt atom itself has no function of reducing the oxide film, so that the silicide layer can be formed only in the second polycrystalline silicon film 25. As a result, the thickness of the silicide layer to be formed can be controlled by the film thickness of the second polycrystalline silicon film 25.

Figure 2A:
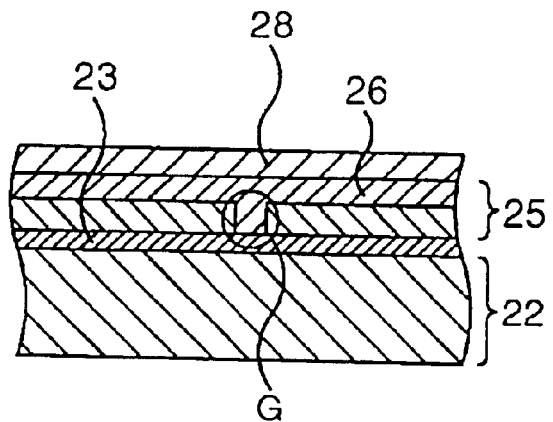
FIGS. 2A to 2C are schematic diagrams showing silicidization reaction in a gate electrode of the semiconductor device shown in FIG. 1.
Figure 2B:
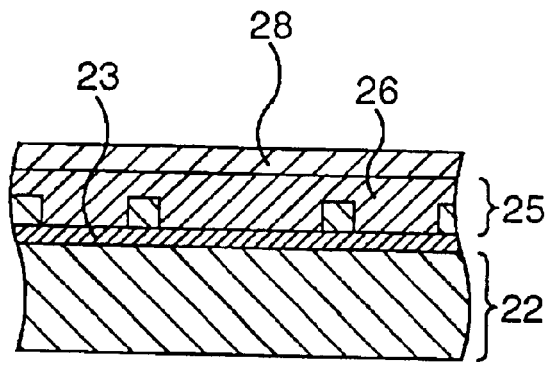
Figure 2C:
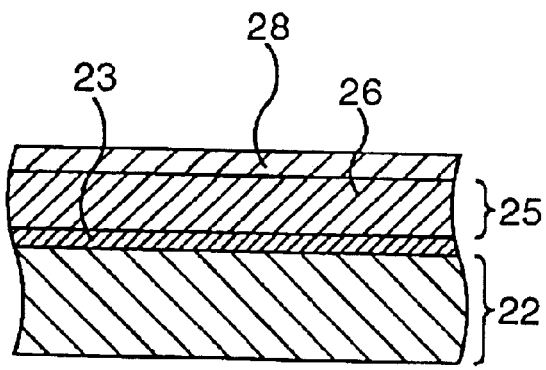

Next, FIGS. 2A to 2C show silicidization reaction processes when a high melting point metal is deposited on the semiconductor device shown in FIG. 1. The following description will be made on an example using cobalt as a high melting point metal for forming a silicide layer.

As shown in FIG. 2A, when cobalt 28 is deposited on the gate electrode of the semiconductor device shown in FIG. 1, silicidization reaction occurs to form a cobalt silicide layer ($CoSi_2$ film) 26 in the second polycrystalline silicon film 25. Here, a portion G different in silicidization reaction locally exists in the formed cobalt silicide layer.

Subsequently, as shown in FIG. 2B, the silicidization reaction proceeds, and the cobalt silicide layer 26 is formed to reach the separation layer 23 at a plurality of portions.

Subsequently, as shown in FIG. 2C, after the silicidization reaction further proceeds, the cobalt silicide layer 26 is not formed in the first polycrystalline silicon film 22 because it is intercepted by the separation layer 23, but the cobalt silicide layer 26 is formed at unreacted portions of the second polycrystalline silicon film 25.

By the way, "SEMICONDUCTOR DEVICE AND ITS MANUFACTURE" in Japanese Patent Laid-open No. Hei 10-209296 discloses 'a gate electrode in a two-layered film structure composed of a lower layer polycrystalline silicon film and an upper layer amorphous silicon film.' The present invention proposes a gate electrode in a two-layered film structure composed of a first polycrystalline silicon film and a second polycrystalline silicon film thereabove which is different in crystal state from the first polycrystalline silicon film. The present invention is different from the above disclosure in that an upper layer is composed of a polycrystalline silicon film.

Besides, "MANUFACTURE OF SEMICONDUCTOR DEVICE" in Japanese Patent Laid-open No. Hei 7-37992 discloses 'a step of forming an amorphous silicon layer on a semiconductor substrate where an element isolation region and a gate insulating film are formed, . . . , a step of changing the amorphous silicon layer to a polycrystalline silicon layers by heat treatment, and a step of forming a metal silicide layer on the polycrystalline silicon layer, and thereafter, . . . .' The present invention differs therefrom in that a first polycrystalline silicon film is formed on a gate insulation film, and thereafter an amorphous silicon film is deposited and crystallized by heat treatment to form a second polycrystalline silicon film so as to form a gate electrode in the two-layer structure. In other words, control of the silicidization reaction, one of the problems that the present invention resolve, is an invention for none but for a two-layer structure, which is clearly different from the gate electrode in a single layer structure described in Japanese Patent Laid-open No. Hei 7-37992.

Next, embodiments based on the outline of the semiconductor device of the present invention and the method for manufacturing the same will be described referring to the accompanying drawings.

This embodiment discloses a CMOS transistor as a semiconductor device.

Figure 4:
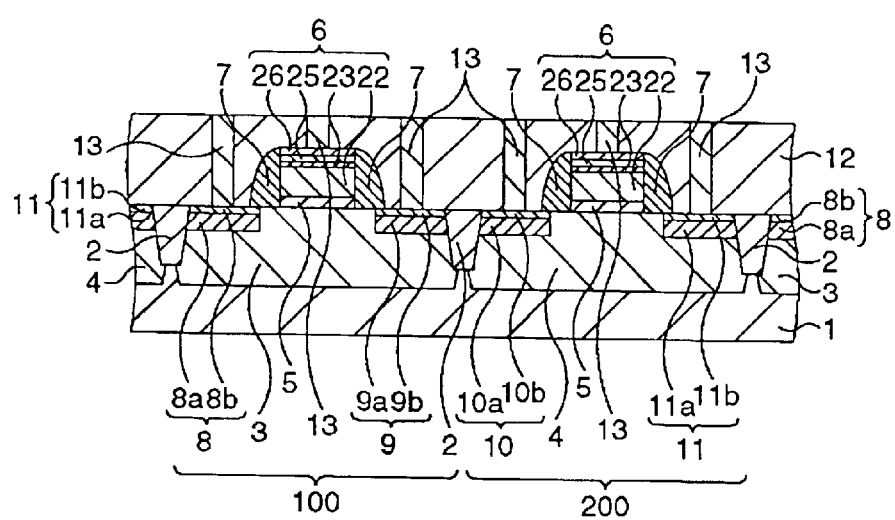
FIG. 4 is a schematic cross-sectional view of a CMOS transistor in an embodiment of the present invention.

FIG. 4 is a schematic diagram of the CMOS transistor in the embodiment of the present invention.

Configuration of CMOS Transistor of the Embodiment

The CMOS transistor of this embodiment includes, as shown in FIG. 4, a semiconductor substrate 1 made of silicon (Si); STIs (Shallow Trench Isolations) 2 which define element active regions of an NMOS transistor 100 and a PMOS transistor 200; a P-type well 3 formed in a region where the NMOS transistor 100 is fabricated; a N-type well 4 formed in a region where the PMOS transistor 200 is fabricated; gate insulation films 5 formed on the semiconductor substrate 1; gate electrodes 6 in predetermined shapes formed on the gate insulation films 5; side walls 7 as protective films formed on sides walls of the gate electrodes 6; a source 8 and a drain 9 formed in a surface layer of the semiconductor substrate 1 within the region where the NMOS transistor 100 is fabricated; a source 10 and a drain 11 formed in the surface layer of the semiconductor substrate 1 within the region where the PMOS transistor 200 is fabricated; an interlayer insulation film 12 which electrically isolates respective wire layers; and tungsten plugs 13 embedded in contact holes in the interlayer insulation film 12.

The gate electrode 6 is formed of a first polycrystalline silicon film 22, a chemical oxide film (separation layer) 23 formed very thin and uniform on the first polycrystalline silicon film 22, and a second polycrystalline silicon film 25 which is formed on the chemical oxide film 23 and is formed therein with a cobalt silicide layer ($CoSi_2$ layer) layer 26. In this embodiment, all the second polycrystalline silicon film 25 may be the cobalt silicide layer 26.

The second polycrystalline silicon film 25 is formed to have more silicon crystal face orientation (111), which is a good match with the cobalt silicide layer, and a smaller crystal particle diameter than the first polycrystalline silicon film 22. Thus formed second polycrystalline silicon film 25 enables formation of a good quality cobalt silicide layer 26 with decreased unreacted portions of silicon. In addition, even if the silicide formation speed is locally different, it is possible to accelerate the silicidization reaction with the unreacted portions of the second polycrystalline silicon film 25 to be faster than the silicidization reaction with the first polycrystalline silicon film 22, resulting in reduced protrusions and depressions on the interface between the cobalt silicide layer and the polycrystalline silicon film.

The chemical oxide film 23 is formed as a separation layer for separating the second polycrystalline silicon film 25 from the first polycrystalline silicon film 22. Even when the reaction speed of the silicidization reaction occurred between the second polycrystalline silicon film 25 and cobalt is locally different, this chemical oxide film 23 can block silicidization reaction between cobalt and the first polycrystalline silicon film 22 to conduct a control for a uniform formation of a silicide layer.

Further, cobalt silicide layers 8b, 9b, 10b, and 11b are formed in surfaces of the source 8 and the drain 9 of the NMOS transistor 100 and the source 10 and the drain 11 of the PMOS transistor 200, respectively. The CMOS transistor of this embodiment is formed in a silicide (Self Align Silicide) structure.

First Method for Manufacturing CMOS Transistor in the Embodiment

Next, a first method for manufacturing the CMOS transistor in the embedment of the present invention will be described.

FIGS. 5A to 5D to FIGS. 7A to 7D are schematic cross-sectional views showing in the order of steps the first method for manufacturing the CMOS transistor in FIG. 4.

Figure 5A:
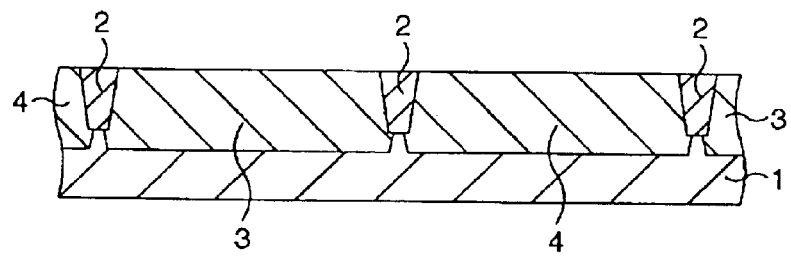
FIGS. 5A to 5D are schematic cross-sectional views showing in the order of steps a first method for manufacturing the CMOS transistor in the embodiment shown in FIG. 4.

First, as shown in FIG. 5A, STIs (Shallow Trench Isolations) 2 are formed in a semiconductor substrate 1 made of silicon (Si) to define element active regions. Thereafter, for example, boron (B) is implanted into a region where an NMOS transistor 100 is to be fabricated to form a P-type well 3, and for example, arsenic (As) is implanted into a region where a PMOS transistor 200 is to be fabricated to form an N-type well 4.

Subsequently, the surface of the semiconductor substrate 1 is heated at a high temperature under a temperature condition of 850° C. to 1050° C. to form a silicon oxide film (SiO$_2$ film) 21 with a film thickness of 5 nm to 10 nm. Thereafter, on the silicon oxide film 21, a first polycrystalline silicon film 22 is formed with a film thickness of 100 nm to 200 nm by the CVD method.

Figure 5B:
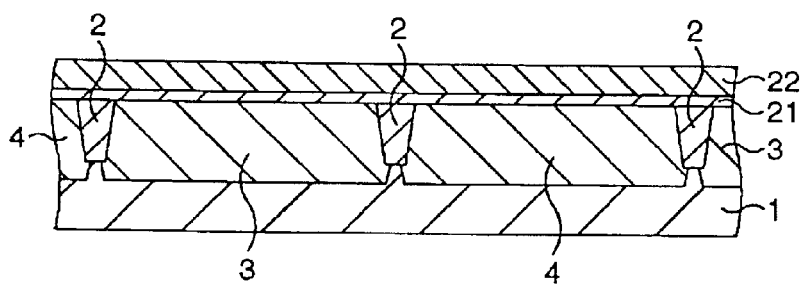
Figure 5C:
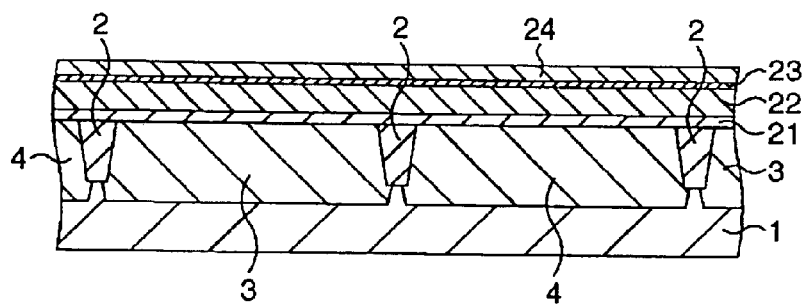

Subsequently, as shown in FIG. 5C, a chemical treatment with a hydrogen peroxide solution or the like is performed to form a chemical oxide film 23 with a film thickness of 0.2 nm to 1.0 nm on the first polycrystalline silicon film 22. The chemical oxide film 23 formed by the chemical treatment can be a very thin film with a uniform film thickness without addition of heat. Thereafter, on the chemical oxide film 23, an amorphous silicon film 24 is deposited to a film thickness of 5 nm to 50 nm by the CVD method.

Figure 5D:
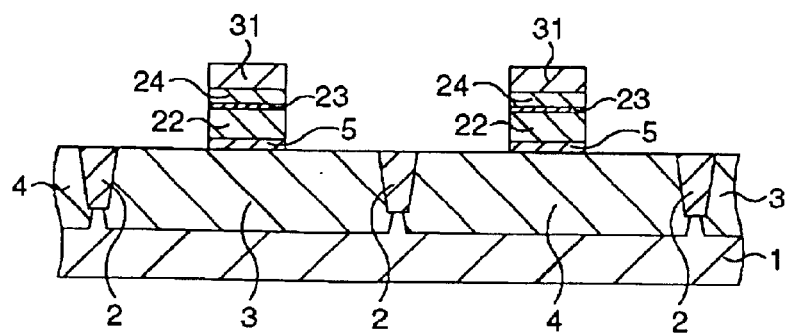

Subsequently, as shown in FIG. 5D, a resist pattern 31 is formed on the amorphous silicon film 24 by photolithography, and dry etching is performed with the resist pattern 31 as a mask to form the amorphous silicon films 24, the chemical oxide films 23 and the first polycrystalline silicon films 22, and gate insulation films 5 made of the silicon oxide films 21, in predetermined shapes.

Figure 6A:
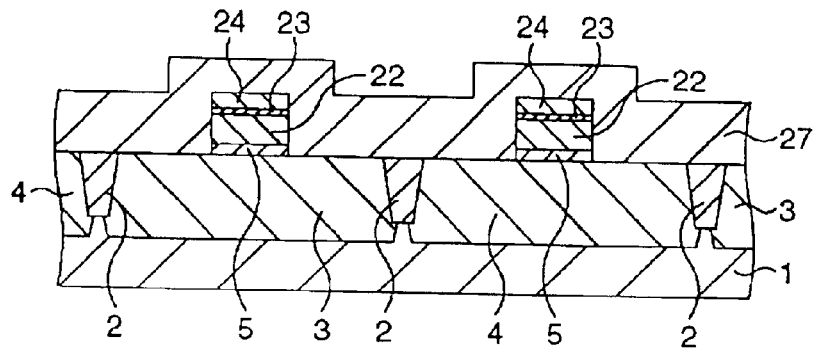
FIGS. 6A to 6D are schematic cross-sectional views showing in the order of steps the first method for manufacturing the CMOS transistor in the embodiment shown in FIG. 4, subsequent to FIGS. 5A to 5D.

Subsequently, the resist patterns 31 are removed by ashing using O$_2$ plasma or the like, and thereafter as shown in FIG. 6A, a silicon oxide film (TEOS) 27 is deposited to a film thickness of 100 nm to 200 nm on the entire face by the CVD method.

Figure 6B:
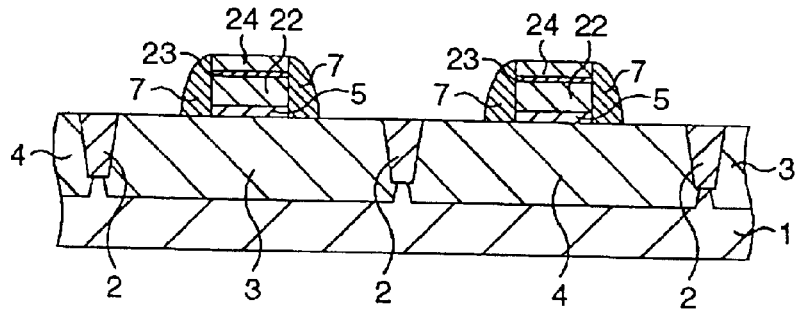

Subsequently, as shown in FIG. 6B, the entire face of the silicon oxide film 27 is anisotropically etched (etched back) by reactive ion etching (RIE) or the like to remain only on both side faces of the amorphous silicon films 24, the chemical oxide films 23, the first polycrystalline silicon films 22, and the silicon oxide films 21 to form sides walls 7.

Figure 6C:
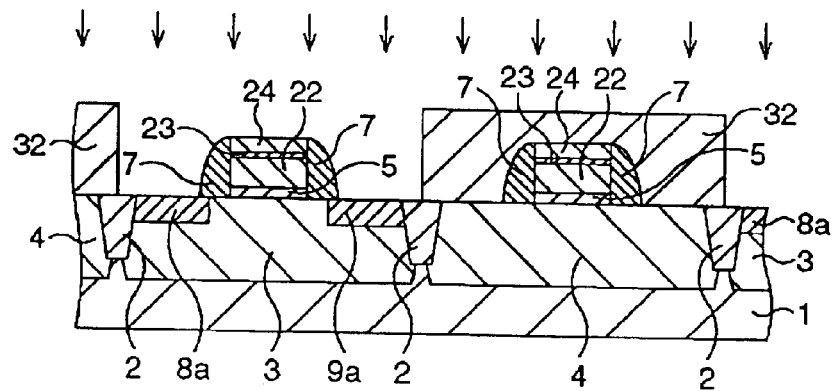

Subsequently, as shown in FIG. 6C, a resist pattern 32, which masks the region where the PMOS transistor 200 is to be fabricated, is formed by photolithography, and arsenic (As) is ion implanted into the entire face thereof under conditions of an acceleration energy of 2 keV to 15 keV, an inclination angle from the vertical direction to the surface of the semiconductor substrate 1 of about 0°, a dose amount of $1 \times 10^{14}/cm^2$ to $8 \times 10^{14}/cm^2$ to form N-type diffusion layers 8a and 9a.

Figure 6D:
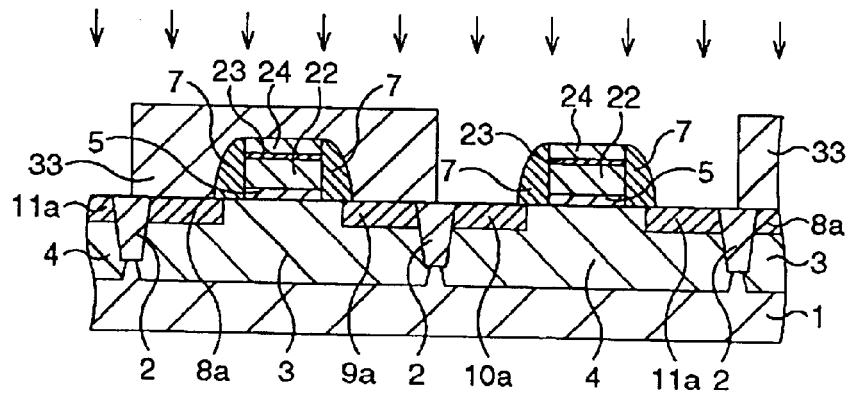

Subsequently, the resist pattern 32 is removed by ashing using O$_2$ plasma or the like. Thereafter, as shown in FIG. 6D, a resist pattern 33, which masks the region where the NMOS transistor 100 is to be fabricated, is formed by photolithography, and phosphorus (P) is ion implanted into the entire face thereof under conditions of an acceleration energy of 15 keV to 25 keV, an inclination angle of about 0°, a dose amount of $2 \times 10^{13}/cm^2$ to $8 \times 10^{14}/cm^2$ to form P-type diffusion layers 10a and 11a.

Figure 7A:
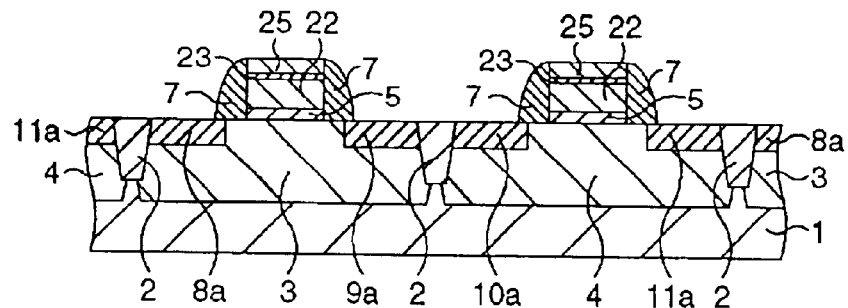
FIGS. 7A to 7D are schematic cross-sectional views showing in the order of steps the first method for manufacturing the CMOS transistor in the embodiment shown in FIG. 4, subsequent to FIGS. 6A to 6D.

Subsequently, the resist pattern 33 is removed by ashing using O$_2$ plasma or the like. Thereafter, as shown in FIG. 7A, annealing is performed for 10 seconds at a temperature of 950° C. to 1050° C. for the surface of the semiconductor substrate 1 to activate the ion implanted impurities as well as to crystallize amorphous silicon films 24 to form second polycrystalline silicon films 25 different in crystal particle diameter and orientation from the first polycrystalline silicon films 22.

Figure 7B:
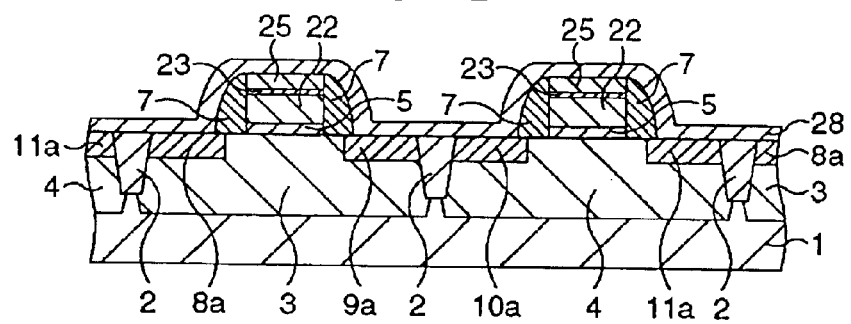

Subsequently, as shown in FIG. 7B, a cobalt thin film (Co thin film) 28 being a high melting point metal film is deposited on the entire face to a film thickness of 5 nm to 15 nm by a sputtering method. Further, a not shown titanium nitride film (TiN) as a cap layer is also deposited in this event.

Figure 7C:
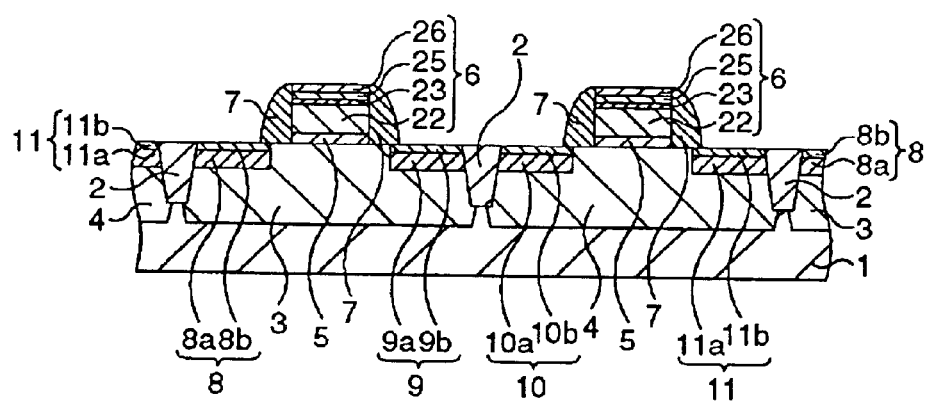

Subsequently, as shown in FIG. 7C, cobalt silicide layers 8b, 9b, 10b, 11b, and 26 are formed by two-step annealing in a self-alignment manner. As for the formation of the cobalt silicide layers 8b, 9b, 10b, 11b, and 26 by the two-step annealing, for example, annealing is performed for 30 seconds at a temperature of 520° C. as a first annealing, then an unreacted portion of the cobalt thin film 28 and the not shown titanium nitride film (TiN) film are removed using an ammonia hydrogen peroxide solution or the like, and annealing is performed for 30 seconds at a temperature of 840° C. as a second annealing. This forms gate electrodes 6 composed of the first polycrystalline silicon films 22, the chemical oxide films 23, the second polycrystalline silicon films 25 having the cobalt silicide layers 26 on upper faces thereof. Further, the source 8 having the N-type diffusion layer 8a with the cobalt silicide layer 8b provided thereon and the drain 9 having the N-type diffusion layer 9a with the cobalt silicide layer 9b provided thereon, are formed in the region where the NMOS transistor 100 is fabricated. The source 10 having the P-type diffusion layer 10a with the cobalt silicide layer 10b provided thereon and the drain 11 having the P-type diffusion layer 11a with the cobalt silicide layer 11b provided thereon, are formed in the region where the PMOS transistor 200 is fabricated.

Figure 7D:
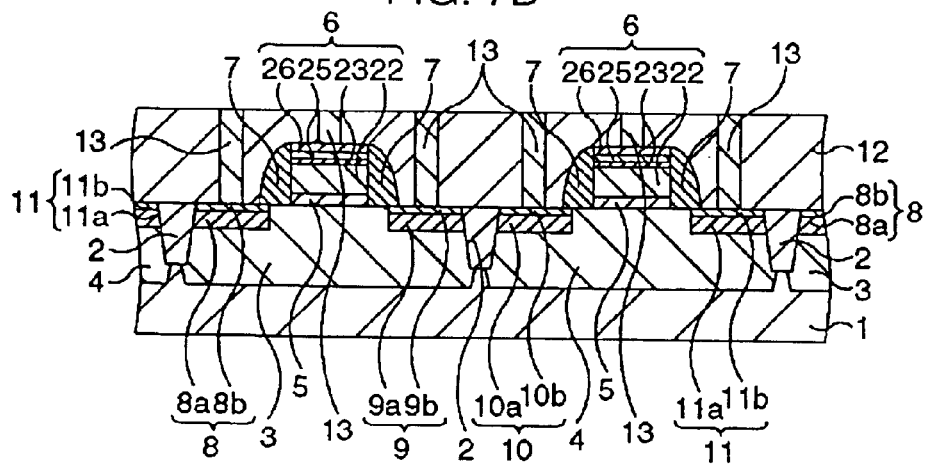

Subsequently, as shown in FIG. 7D, an interlayer insulation film 12 is deposited by the CVD method, and contact holes for lead electrodes are formed in the interlayer insulation film 12 by dry etching. Then, tungsten (W) is deposited on the entire face by the CVD method, and thereafter its surface is polished by CMP to form tungsten plugs 13 embedded in the contact holes.

Thereafter, lead electrodes to be connected to the tungsten plugs 13 are formed, and then a surface protective film (passivation protective film) for protecting the device is further formed, thus completing the CMOS transistor of this embodiment.

Second Method for manufacturing CMOS Transistor in the Embodiment

Next, a second method for manufacturing the CMOS transistor in the embedment of the present invention will be described. In the second manufacturing method, crystallization of an amorphous silicon film 24 by high-temperature heating to form a second polycrystalline silicon film 25 is performed before patterning using a resist. Note that the same numerals are assigned to components and so on as those described in the first manufacturing method.

In the second manufacturing method, first, the respective steps in FIGS. 5A to 5C are performed.

Figure 8A:
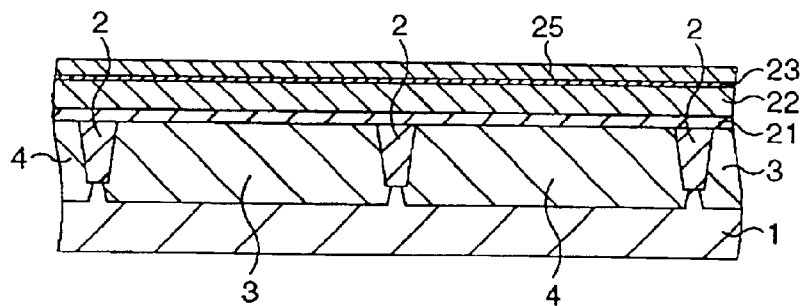
FIGS. 8A to 8D are schematic cross-sectional views showing in the order of steps a second method for manufacturing the CMOS transistor in the embodiment shown in FIG. 4.

Subsequently, as shown in FIG. 8A, annealing is performed for 10 seconds at a temperature of 950° C. to 1050° C. for the surface of a semiconductor substrate 1 to crystallize the amorphous silicon film 24 to form the second polycrystalline silicon film 25 different in crystal particle diameter and orientation from a first polycrystalline silicon film 22.

Figure 8B:
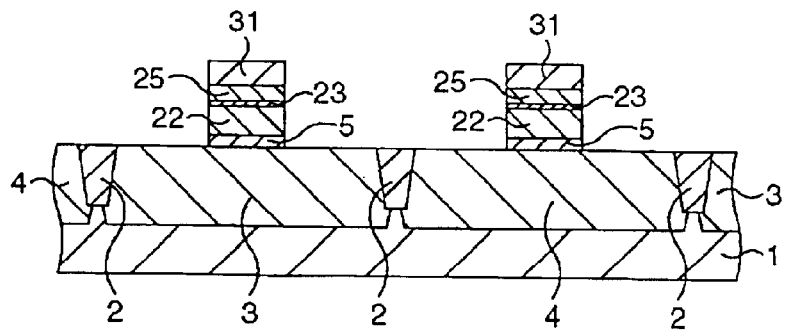

Subsequently, as shown in FIG. 8B, a resist pattern 31 is formed on the second polycrystalline silicon film 25 by photolithography, and dry etching is performed with the resist pattern 31 as a mask to form the second polycrystalline silicon films 25, chemical oxide films 23, the first polycrystalline silicon films 22, and gate insulation films 5 made of silicon oxide films 21, in predetermined shapes.

Figure 8C:
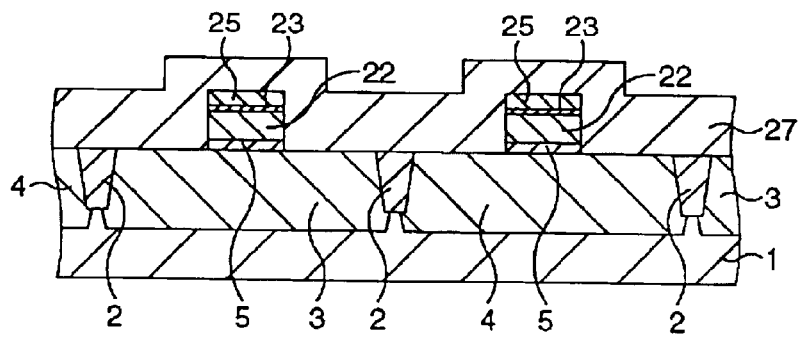

Subsequently, the resist patterns 31 are removed by ashing using O$_2$ plasma or the like, and thereafter as shown in FIG. 8C, a silicon oxide film (TEOS) 27 is deposited to a film thickness of 100 nm to 200 nm on the entire face by the CVD method.

Figure 8D:
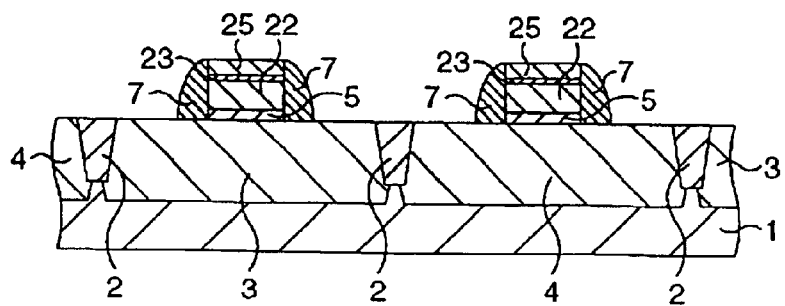

Subsequently, as shown in FIG. 8D, the entire face of the silicon oxide film 27 is anisotropically etched (etched back) by reactive ion etching (RIE) or the like to remain only on both side faces of the second polycrystalline silicon films 25, the chemical oxide films 23, the first polycrystalline silicon films 22, and the silicon oxide films 21 to form sides walls 7.

Figure 9A:
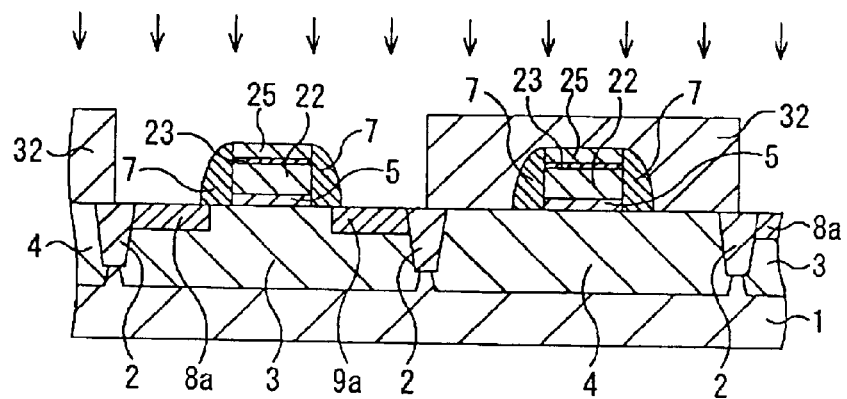
FIGS. 9A to 9C are schematic cross-sectional views showing in the order of steps the second method for manufacturing the CMOS transistor in the embodiment shown in FIG. 4, subsequent to FIGS. 8A to 8D.

Subsequently, as shown in FIG. 9A, a resist pattern 32, which masks a region where a PMOS transistor 200 is to be fabricated, is formed by photolithography, and arsenic (As) is ion implanted into the entire face thereof under conditions of an acceleration energy of 2 keV to 15 keV, an inclination angle of about 0°, a dose amount of $1 \times 10^{14}/cm^2$ to $8 \times 10^{14}/cm^2$ to form N-type diffusion layers 8a and 9a.

Figure 9B:
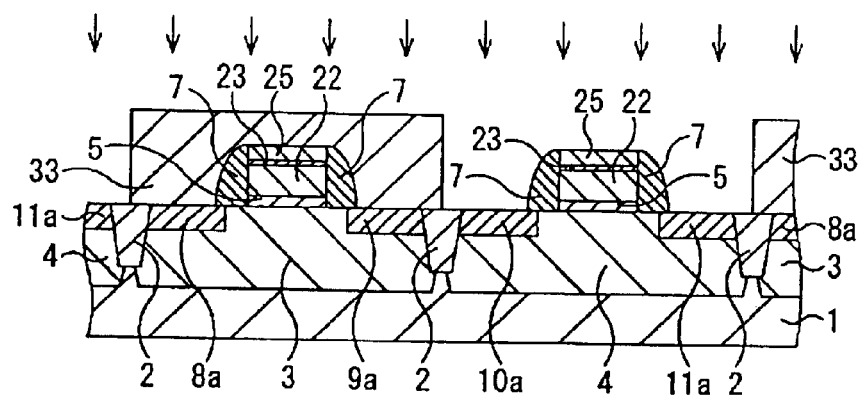

Subsequently, the resist pattern 32 is removed by ashing using O$_2$ plasma or the like. Thereafter, as shown in FIG. 9B, a resist pattern 33, which masks a region where an NMOS transistor 100 is to be fabricated, is formed by photolithography, and phosphorus (P) is ion implanted into the entire face thereof under conditions of an acceleration energy of 15 keV to 25 keV, an inclination angle of about 0°, a dose amount of $2 \times 10^{13}/cm^2$ to $8 \times 10^{14}/cm^2$ to form P-type diffusion layers 10a and 11a.

Figure 9C:
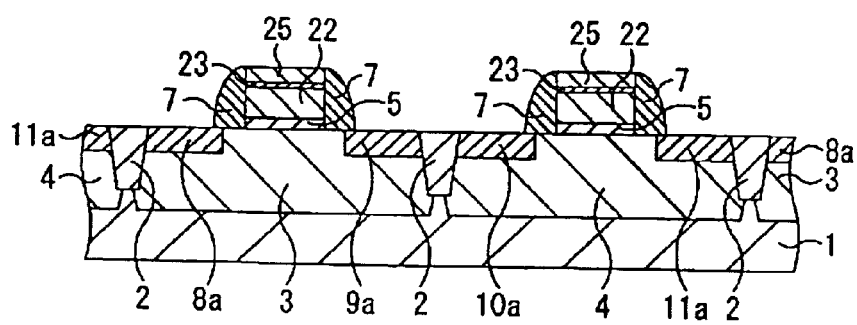

Subsequently, the resist pattern 33 is removed by ashing using O$_2$ plasma or the like. Thereafter, as shown in FIG. 9C, annealing is performed for 10 seconds at a temperature of 950° C. to 1050° C. for the surface of the semiconductor substrate 1 to activate the ion implanted impurities.

Subsequently, the respective steps in FIGS. 7B to 7D are performed.

Thereafter, lead electrodes to be connected to tungsten plugs 13 are formed, and then a surface protective film (passivation protective film) for protecting the device is further formed, thus completing the CMOS transistor of this embodiment.

The device using cobalt silicide as a high melting point metal silicide is disclosed in this embodiment, but the present invention is not limited to this. For example, titanium silicide, nickel silicide, and platinum silicide are also applicable. When the film thickness of the second polycrystalline silicon film 25 is made no more than 3.5 times the thickness of cobalt silicide, no more than 2.5 times the thickness of titanium silicide, no more than 3.6 times the thickness of nickel silicide, or no more than 2.0 times the thickness of platinum silicide, the film thickness of silicide to be formed can be controlled by the film thickness of the second polycrystalline silicon film 25.

Besides, the device using the chemical oxide film 23 as a separation layer, which is formed for varying the second polycrystalline silicon film 25 from the first polycrystalline silicon film 22 in crystal face orientation and crystal particle diameter, is disclosed in this embodiment, but the present invention is not limited to this. A separation layer is applicable as long as it is formed of a material other than the polycrystalline silicon film and satisfies the above-described main function, and may be composed of a conductor or the like.

Verification Results of Characteristics of CMOS Transistor of the Embodiment

Figure 10:
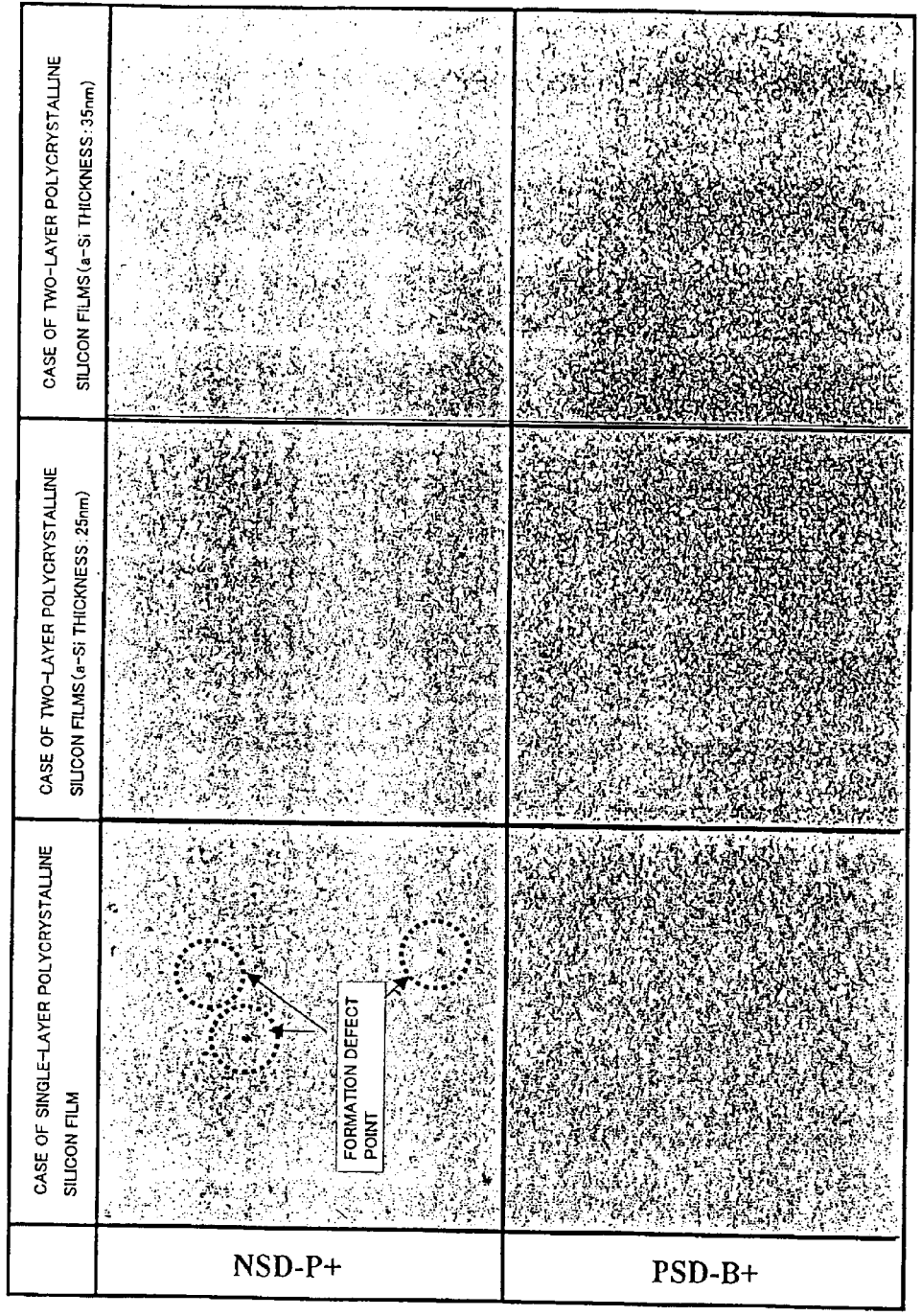
FIG. 10 is microphotographs each showing a surface state of a silicide layer formed in a polycrystalline silicon film.

FIG. 10 is surface views of cobalt silicide layers formed in gate electrodes in the CMOS transistors of this embodiment. For comparison, a surface view in a case of a single-layer polycrystalline silicon film is also shown. FIG. 10 verifies that while there exist formation defects due to unreacting silicon in the silicide layer in the case of the single-layer polycrystalline silicon film, such a formation defect is not recognized in the CMOS transistors of this embodiment having two-layer polycrystalline silicon films in which excellent silicide layers can be formed.

Figure 11:
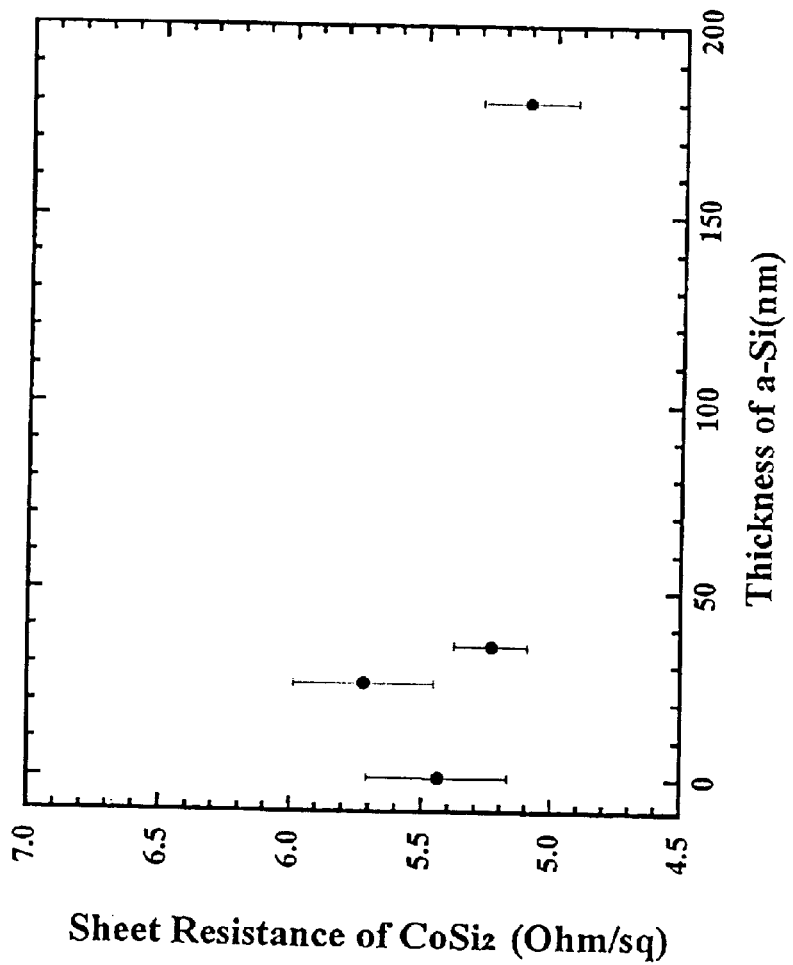
FIG. 11 is a characteristic chart of a resistance value of a cobalt silicide layer formed in the gate electrode in the CMOS transistor of the embodiment.

FIG. 11 is a characteristic chart of a resistance value of the cobalt silicide layer formed in the gate electrode in the CMOS transistor of this embodiment. In comparison with a case of a CMOS transistor in a conventional example shown in FIG. 12, at a thickness of 100 nm (0.1 $\mu$m) or less, the conventional CMOS transistor sharply rises in resistance value to 10 Ω or more per unit area, while the CMOS transistor of this embodiment rises to 6 Ω or less per unit area. It was verified that line width dependence, that is, a thin wire effect of the resistance value of the silicide layer can be suppressed. Further, it was verified that the silicidization reaction can be controlled by the film thickness of the second polycrystalline silicon film 25 from the fact that changes were recognized in the resistance values of the silicide layers (25 nm and 35 nm) depending on the film thickness of the second polycrystalline silicon film 25.

According to the present invention, a silicide layer can be formed excellent and uniform in a gate electrode to enable realization of a highly reliable semiconductor device and a method for manufacturing the same which restrain the increase in resistance value of a gate electrode caused by a thin wire effect, decrease resistance variations of the gate electrode, and prevent deterioration of the gate electrode.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a semiconductor substrate;
   a gate insulation film formed on said semiconductor substrate; and
   a gate electrode formed on said gate insulation film, said gate electrode comprising:
   a first polycrystalline silicon film formed on said gate insulation film; and
   a second polycrystalline silicon film formed above said first polycrystalline silicon film, said second polycrystalline silicon film being in a different crystal state from said first polycrystalline silicon film, and at least an upper layer thereof being silicidized.

2. The semiconductor device according to claim 1, further comprising:
   a separation layer, provided between said first polycrystalline silicon film and said second polycrystalline silicon film, for intercepting silicidization of said first polycrystalline silicon film.

3. The semiconductor device according to claim 1, wherein said different crystal state denotes varying said second polycrystalline silicon film from said first polycrystalline silicon film in crystal face orientation.

4. The semiconductor device according to claim 2, wherein said different crystal state denotes varying said second polycrystalline silicon film from said first polycrystalline silicon film in crystal face orientation.

5. The semiconductor device according to claim 3, wherein a proportion of a silicon crystal face orientation (111) of said second polycrystalline silicon film is greater than that of said first polycrystalline silicon film.

6. The semiconductor device according to claim 4, wherein a proportion of a silicon crystal face orientation (111) of said second polycrystalline silicon film is greater than that of said first polycrystalline silicon film.

7. The semiconductor device according to claim 1, wherein said different crystal state denotes varying said second polycrystalline silicon film from said first polycrystalline silicon film in crystal particle diameter.

8. The semiconductor device according to claim 2, wherein said different crystal state denotes varying said second polycrystalline silicon film from said first polycrystalline silicon film in crystal particle diameter.

9. The semiconductor device according to claim 7, wherein a crystal particle diameter of said second polycrystalline silicon film is smaller than that of said first polycrystalline silicon film.

10. The semiconductor device according to claim 8, wherein a crystal particle diameter of said second polycrystalline silicon film is smaller than that of said first polycrystalline silicon film.

11. The semiconductor device according to claim 1, wherein any one of a cobalt silicide layer, a titanium silicide layer, a nickel silicide layer, and a platinum silicide layer is formed in said second polycrystalline silicon film by said silicidization.

12. The semiconductor device according to claim 2, wherein any one of a cobalt silicide layer, a titanium silicide layer, a nickel silicide layer, and a platinum silicide layer is formed in said second polycrystalline silicon film by said silicidization.

13. A method for manufacturing a semiconductor device, comprising:
   a first step of forming a first polycrystalline silicon film above a semiconductor substrate with a gate insulation film intervening therebetween;
   a second step of forming above said first polycrystalline silicon film a second polycrystalline silicon film different in crystal state from said first polycrystalline silicon film; and
   a third step of siliciding at least an upper portion of said second polycrystalline silicon film to form a gate electrode comprising said first polycrystalline silicon film and said silicidized second polycrystalline silicon film.

14. The method for manufacturing a semiconductor device according to claim 13, further comprising:
   after said first step and before said second step, a step of forming on said first polycrystalline silicon film a separation layer for intercepting silicidization of said first polycrystalline silicon film.

15. The method for manufacturing a semiconductor device according to claim 13, wherein said different crystal state denotes varying said second polycrystalline silicon film from said first polycrystalline silicon film in crystal face orientation.

16. The method for manufacturing a semiconductor device according to claim 14, wherein said different crystal state denotes varying said second polycrystalline silicon film from said first polycrystalline silicon film in crystal face orientation.

17. The method for manufacturing a semiconductor device according to claim 15, wherein a proportion of a silicon crystal face orientation (111) of said second polycrystalline silicon film is made greater than that of said first polycrystalline silicon film.

18. The method for manufacturing a semiconductor device according to claim 16, wherein a proportion of a silicon crystal face orientation (111) of said second polycrystalline silicon film is made greater than that of said first polycrystalline silicon film.

19. The method for manufacturing a semiconductor device according to claim 13, wherein said different crystal state denotes varying said second polycrystalline silicon film from said first polycrystalline silicon film in crystal particle diameter.

20. The method for manufacturing a semiconductor device according to claim 14, wherein said different crystal state denotes varying said second polycrystalline silicon film from said first polycrystalline silicon film in crystal particle diameter.

21. The method for manufacturing a semiconductor device according to claim 19, wherein a crystal particle diameter of said second polycrystalline silicon film is made smaller than that of said first polycrystalline silicon film.

22. The method for manufacturing a semiconductor device according to claim 20, wherein a crystal particle diameter of said second polycrystalline silicon film is made smaller than that of said first polycrystalline silicon film.

23. The method for manufacturing a semiconductor device according to claim 13, wherein said second step forms said second polycrystalline silicon film by depositing an amorphous silicon film and thereafter applying a heat treatment to said amorphous silicon film to crystallize said amorphous silicon film.

24. The method for manufacturing a semiconductor device according to claim 14, wherein said second step forms said second polycrystalline silicon film by depositing an amorphous silicon film and thereafter applying a heat treatment to said amorphous silicon film to crystallize said amorphous silicon film.

25. The method for manufacturing a semiconductor device according to claim 13, wherein said silicidization is controlled by a film thickness of said second polycrystalline silicon film.

26. The method for manufacturing a semiconductor device according to claim 14, wherein said silicidization is controlled by a film thickness of said second polycrystalline silicon film.

27. The method for manufacturing a semiconductor device according to claim 13, wherein any one of a cobalt silicide layer, a titanium silicide layer, a nickel silicide layer, and a platinum silicide layer is formed in said second polycrystalline silicon film by said silicidization.

28. The method for manufacturing a semiconductor device according to claim 14, wherein any one of a cobalt silicide layer, a titanium silicide layer, a nickel silicide layer, and a platinum silicide layer is formed in said second polycrystalline silicon film by said silicidization.

* * * * *